United States Patent [19]

Yamagata

[11] Patent Number: 5,331,592
[45] Date of Patent: Jul. 19, 1994

[54] NON-VOLATILE SEMICONDUCTOR MEMORY DEVICE WITH ERASURE CONTROL CIRCUIT

[75] Inventor: Yasushi Yamagata, Tokyo, Japan

[73] Assignee: NEC Corporation, Tokyo, Japan

[21] Appl. No.: 62,396

[22] Filed: May 17, 1993

[30] Foreign Application Priority Data

May 15, 1992 [JP] Japan .................................. 4-148575

[51] Int. Cl.$^5$ .............................................. G11C 11/40
[52] U.S. Cl. ................................ 365/185; 365/189.09; 365/210; 365/218
[58] Field of Search .................... 365/185, 218, 189.09, 365/210

[56] References Cited

U.S. PATENT DOCUMENTS

| | | | |
|---|---|---|---|
| 5,109,361 | 4/1992 | Yim et al. | 365/218 |
| 5,168,465 | 12/1992 | Harari | 365/185 |
| 5,218,571 | 6/1993 | Norris | 365/189.09 |
| 5,220,528 | 6/1993 | Mielke | 365/218 |
| 5,220,533 | 6/1993 | Turner | 365/185 |
| 5,231,602 | 7/1993 | Radjy et al. | 365/185 |

OTHER PUBLICATIONS

Verma, G., and Mielke, N., "Reliability Performance of ETOX Based Flash Memories," *IEEE/IRPS*, 1988, pp. 158-166.

Kynett, V. N., et al., "An In-System Reprogrammable 32K×8 CMOS Flash Memory," *IEEE Journal of Solid-State Circuits*, vol. 23, No. 5, Oct. 1988, pp. 1157-1163.

Primary Examiner—Joseph E. Clawson, Jr.
Attorney, Agent, or Firm—Mason, Fenwick & Lawrence

[57] ABSTRACT

A non-volatile semiconductor memory device has an erasure control circuit which, during erasure operation, is switched to a source of a memory cell having a floating gate. The erasure control circuit is constituted by a resistor element and a reference transistor having the same structure as that of the memory cell. One end of the resistor element is connected to a node which, during erasure operation, is electrically connected to the source of the memory cell. The reference transistor has a drain connected to the node, a gate connected to a constant-voltage source, and a source grounded. A floating gate/substrate insulating film of the memory cell and a floating gate/substrate insulating film of the reference transistor are formed simultaneously in the same fabrication step so that the thickness of these insulating films are substantially the same. Even when the thickness of the floating gate/substrate insulating film of the memory cell varies due to production variations, it is possible to prevent the occurrence of an over-erase or a deficient erase by making changes accordingly in the erasure voltage, that is, the voltage at the node.

3 Claims, 7 Drawing Sheets

NON-VOLATILE SEMICONDUCTOR MEMORY DEVICE WITH ERASURE CONTROL CIRCUIT

BACKGROUND OF THE INVENTION (1) Field of the Invention

The present invention relates to a non-volatile semiconductor memory device, and more particularly to a non-volatile semiconductor memory device capable of performing electrical write and electrical flash erasure (hereinafter referred to as "Flash EEPROM).

(2) Description of the Related Art

A typical example of the "Flash EEPROM" of the kind mentioned above is disclosed, for example, as "An In-System Reprogrammable 32K×8 CMOS Flash Memory" in Journal of Solid-State Circuits, Vol. 23, No. 5, October 1988, pages 1157–1163. Performance of memories is disclosed in 1988 IEEE/IRPS, pages 158–166. Explanation on the prior art is made herein with reference to FIGS. 1–4.

FIG. 1 shows in sectional view a memory cell unit which is constituted by a drain 52 and a source 53 formed on a P-type semiconductor substrate 51, a floating gate 55 provided on a channel region between the drain and the source through a tunnel insulating film 54, and a control gate 57 provided over the floating gate 55 through an insulating film 56.

Now, performance of the above memory cell unit is explained. Data write is performed, as shown in FIG. 2, by grounding the source 53, and applying high voltages Vg and Vd to the control gate 57 and the drain 52, respectively, thereby injecting to the floating gate 55 the electrons generated by impact ionization in the neighborhood of the drain 52.

Erasure of data is performed, as shown in FIG. 3, by grounding the control gate 57, opening or grounding the drain 52, and applying a high voltage $V_{PP}$ to the source 53, thereby tunnel-discharging the electrons to the floating gate 55.

As shown in FIG. 4, a memory cell array is formed by having a plurality of memory cell units described above arranged in a matrix form. A plurality of word lines 58 are formed by commonly connecting the control gates of the respective memory cells positioned in the same row. A plurality of bit lines 59 are formed by commonly connecting the drains of the respective memory cells positioned in the same column. A plurality of source lines 60 are formed by commonly connecting the sources of the respective memory cells positioned in the same column.

The plurality of word lines 58 are connected to a row select circuit 62 and the plurality of bit lines 59 are connected to a column select circuit 61. The plurality of source lines 60 which are commonly connected together are electrically connected, through a switching circuit 63, to the ground (ground potential) during the reading/writing of memory cells and to an erasure control circuit 64 during the erasure of memory cells.

The non-volatile semiconductor memory device further includes a read control circuit 65 for controlling the read of memory cells and a write control circuit 66 for controlling the write of memory cells. The outputs of the read control circuit 65, the write control circuit 66 and the erasure control circuit 64 are inputted to the row select circuit 62 and the column select circuit 61.

Next, performance of the memory device is explained. During the writing, the source lines 60 are grounded through the switching circuit 63 and the control circuit 66 operates so that one memory cell is written with one bit line and one word line being caused to be made high potential by the column select circuit 61 and the row select circuit 62. During the reading, the source lines 60 are grounded as in the case of writing, and the read control circuit 65 operates so that one memory cell is read with one line and one word line being set to a predetermined voltage (about 5 V) by the column select circuit 61 and the row select circuit 62.

During the erasure of memory cells, the source lines 60 are electrically connected to the erasure control circuit 64 through the switch circuit 63, and the erasure control circuit 64 operates so that all the bit lines are turned to an open state and all the memory cells are erased with the source lines 60 being set to a high potential (about 15 V) and all the word lines being set to a ground potential.

As shown in FIG. 5, the conventional erasure control circuit is constituted by an N-channel enhancement mode transistor Q5 which has a drain electrode connected to a high voltage power supply terminal 1, a gate electrode connected to an erasure control terminal 90, and a source electrode connected to a switching circuit 63. For the erasure operation, a signal is inputted to the erasure control terminal 90 and the transistor Q5 is turned ON for an erasing time period $t_e$ during which a high voltage is applied to the source lines of the memory cells through the switching circuit 63.

The erasing time period $t_e$ is appropriately set so as not to cause the occurrence of "over-erasure". If the over-erasure occurs, the data cannot be correctly read out.

FIG. 6 shows the relationship between the threshold value $V_{TM}$ of the memory cell and the erasing time t. As noted from this, in the initial state, when the erasing time period prolongs (in this case, beyond $T_O$), the threshold value of the memory cell which has been written-in in the level of $V_{TM}$~5 V becomes a negative value. This state is a depletion state in which the transistor concerned turns ON even where the gate is grounded. This is how the over-erasure develops.

Now, it is assumed that the memory cell H in FIG. 4 is over-erased. Also, assuming that, for example, data is written in the memory cell I and the data is now to be read, then no current flows across the drain/source at the selected memory cell I.

However, since the current does flow across the drain/source at the non-selected memory cell H, the current flows also in the bit line 59 whereby the memory cell I which is an OFF bit is detected as an ON bit.

Therefore, in the conventional erasure control circuit, the erasing time period $t_e$ is so set as not to cause the occurrence of over-erase of a memory cell.

In the conventional non-volatile semiconductor memory device as described above, a problem encountered is that, due to fabrication variations, the thickness of an insulating film between the floating gate and the substrate of the memory cell (hereinafter referred to as "floating gate/substrate insulating film") tends to be too thin or too thick, in which case the over-erase or deficient erase can easily occur.

FIG. 7 is a graph showing the relationship between the threshold value of the memory cell after the erasure and the thickness of the floating gate/substrate insulating film when the conventional circuit is used. The graph shows that the threshold value of the memory cell after the erasure time of $t_e$ have the thickness dependency of the floating gate/substrate insulating film. The thinner the insulating film, the lower the threshold value after the erasure and finally the threshold value turns to a negative value, hence turning to an over-erase state.

Also, the thicker the insulating film, the higher the threshold value after the erasure, resulting in a deficient erasure. In other words, where the erasure time and the applied voltage are constant, the over-erasure or deficient erasure is caused by variations in the thickness of the floating gate/substrate insulating film.

The reason for the above is that, during the erasure, the electric field applied between the source and the floating gate is larger and the erasure speed becomes faster as the insulating film becomes thinner.

With the conventional erasure control circuit explained above, it is difficult to set an appropriate erasure time by estimating in advance the variations in the thickness of the floating gate/substrate insulating film.

SUMMARY OF THE INVENTION

It is, therefore, an object of the present invention to overcome the problems in the conventional arrangement and to provide an improved non-volatile semiconductor memory device which enhances the reliability of the erasure performance.

According to one aspect of the invention, there is provided a non-volatile semiconductor memory device having an erasure control circuit which, during erasure operation, is electrically connected through a switching circuit to a source of a memory cell transistor having a floating gate, the erasure control circuit comprising:

a resistor element having one end connected to a power supply terminal and the other end connected to a node which is electrically connected to the source of the memory cell transistor during the erasure operation; and a reference transistor which has the same structure as that of the memory cell transistor, and in which a drain electrode is connected to the node, a gate electrode is connected to a constant-voltage input terminal and a source electrode is grounded, the reference transistor having a floating gate/substrate insulating film formed simultaneously through a common process for forming a floating gate/substrate insulating film of the memory cell transistor and the floating gate/substrate insulating film of the reference transistor having substantially the same thickness as that of the memory cell transistor.

According to another aspect of the invention, the erasure control circuit may further include an amplifier provided between the node and the switching circuit.

According to still another aspect of the invention, it is arranged that the control gate and the floating gate in the reference transistor are short-circuitted.

According to the invention, the changes in erasure speeds caused by the variations in the thickness of the floating gate/substrate insulating film are corrected by changing the erasure voltage.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF INVENTION

Now, the first embodiment according to the invention is explained with reference to the drawings.

Figure 1:
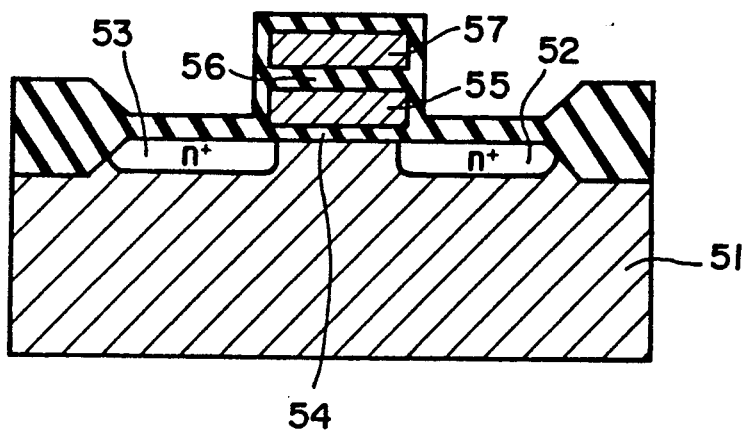
FIG. 1 is a diagrammatic sectional view showing a conventional memory cell unit.
Figure 2:
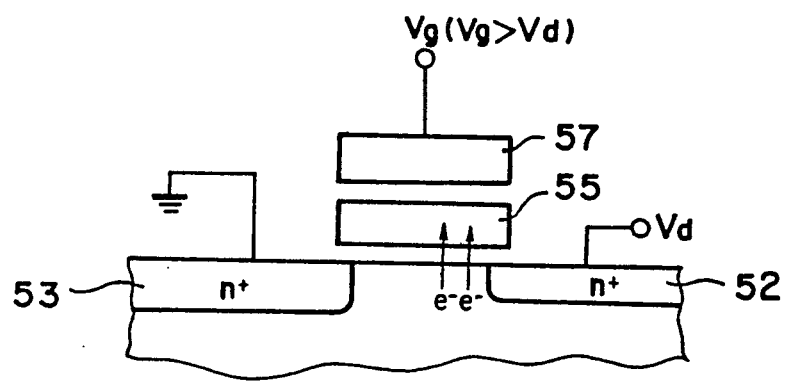
FIG. 2 is a schematic representation of a conventional memory cell unit for illustrating write operation.
Figure 3:
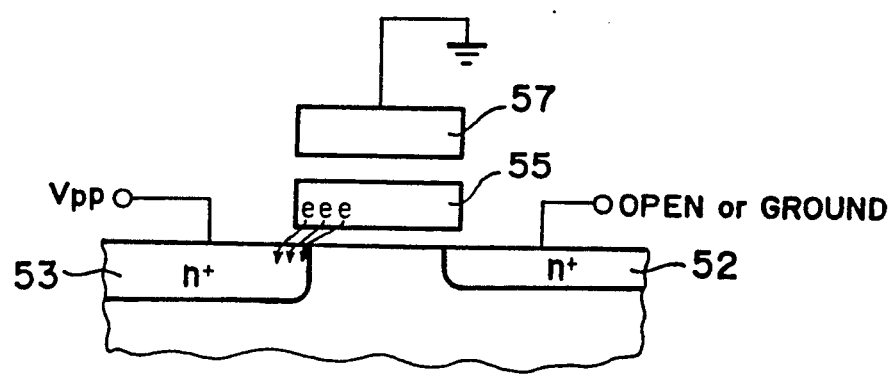
FIG. 3 is a schematic representation of a conventional memory cell unit for illustrating erasure operation.
Figure 4:
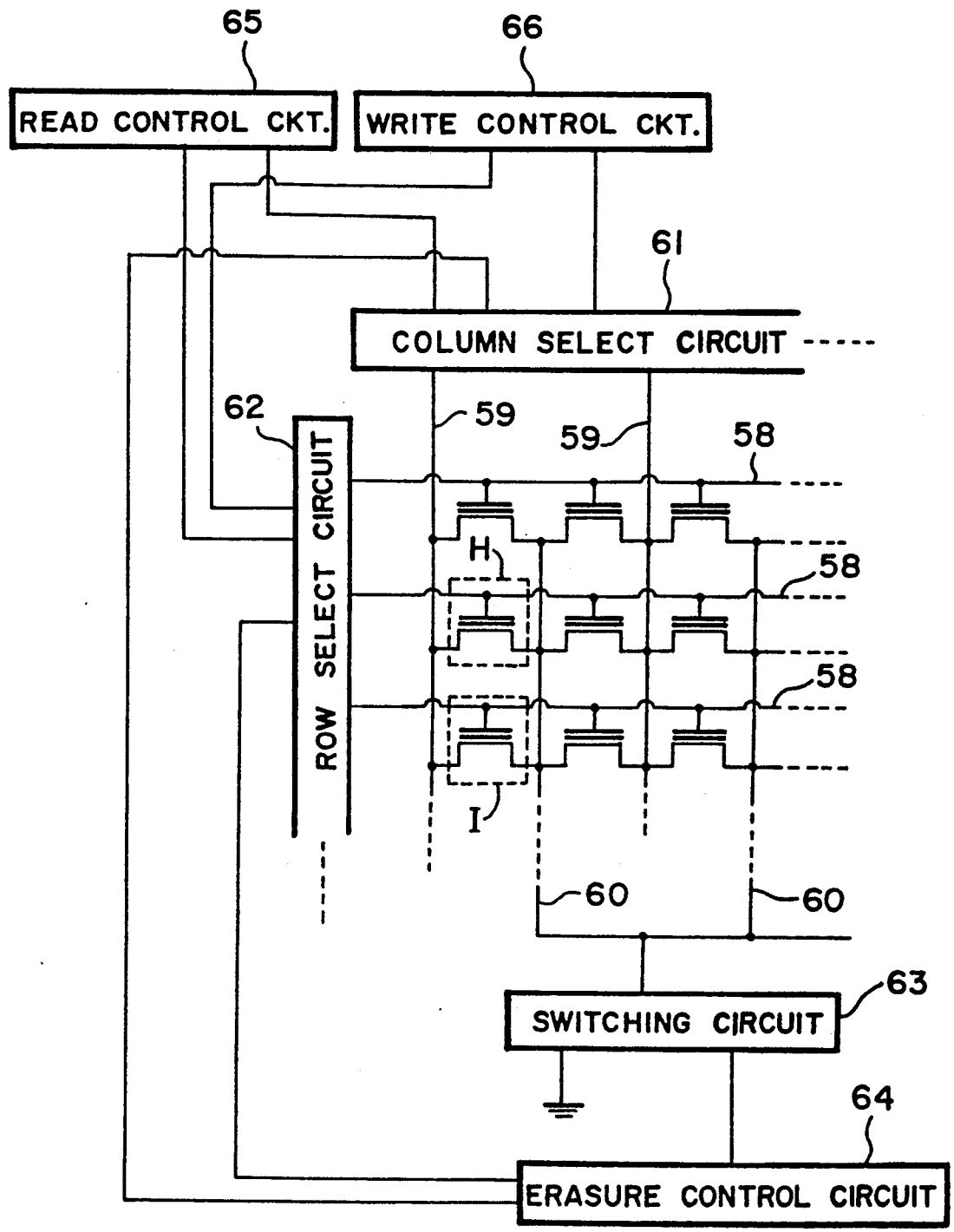
FIG. 4 is a circuit diagram showing a conventional memory cell array.
Figure 5:
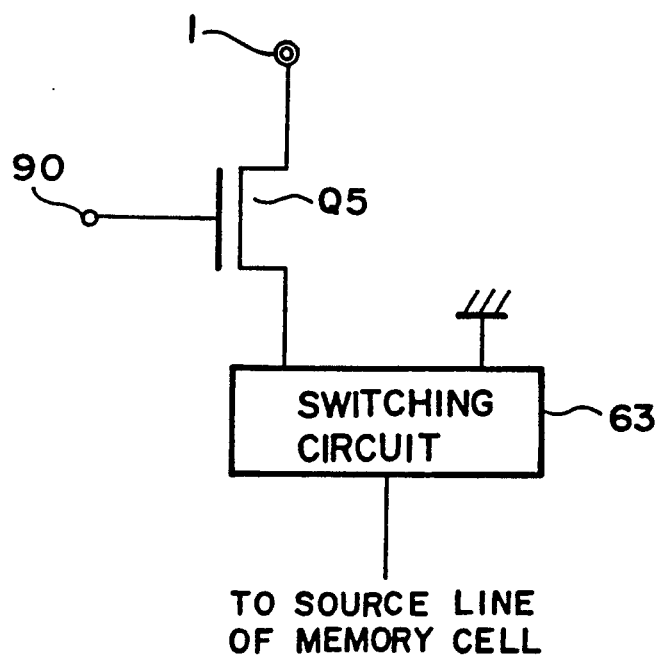
FIG. 5 is a schematic representation of a conventional erasure control circuit.
Figure 6:
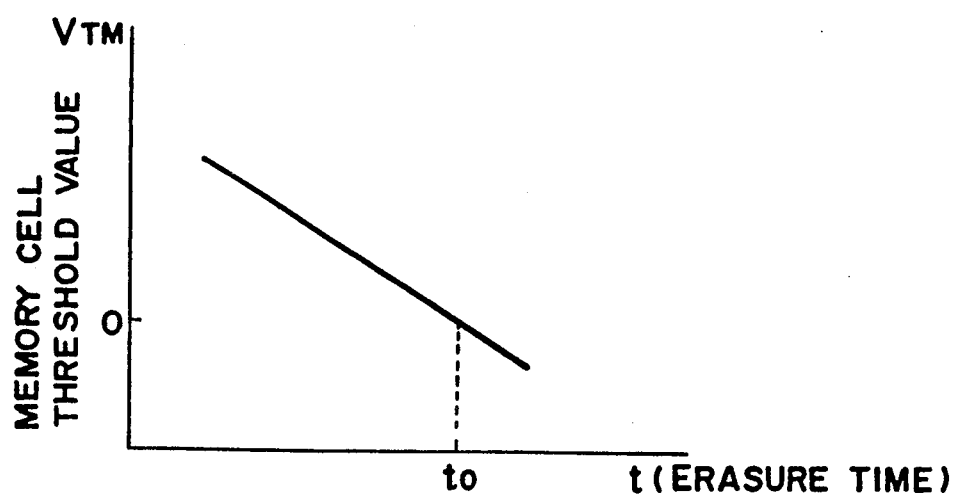
FIG. 6 is a graph showing a typical erasure characteristic in a conventional memory cell.
Figure 7:
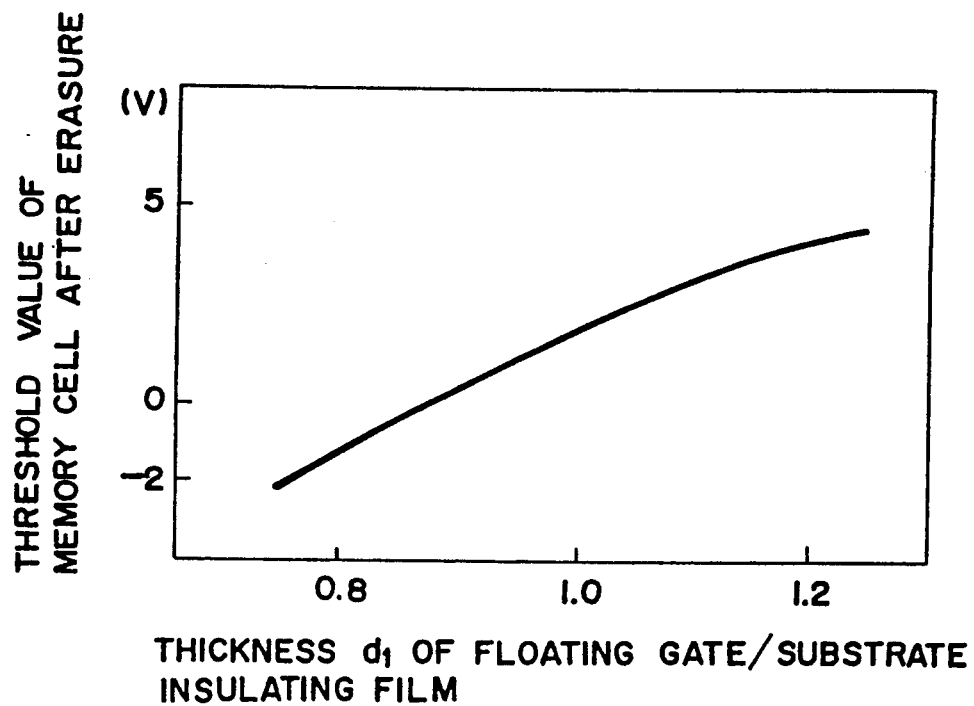
FIG. 7 is a graph showing a relationship between threshold values of a memory cell after erasure and a thickness of a floating gate/substrate insulating film in a conventional circuit.
Figure 8:
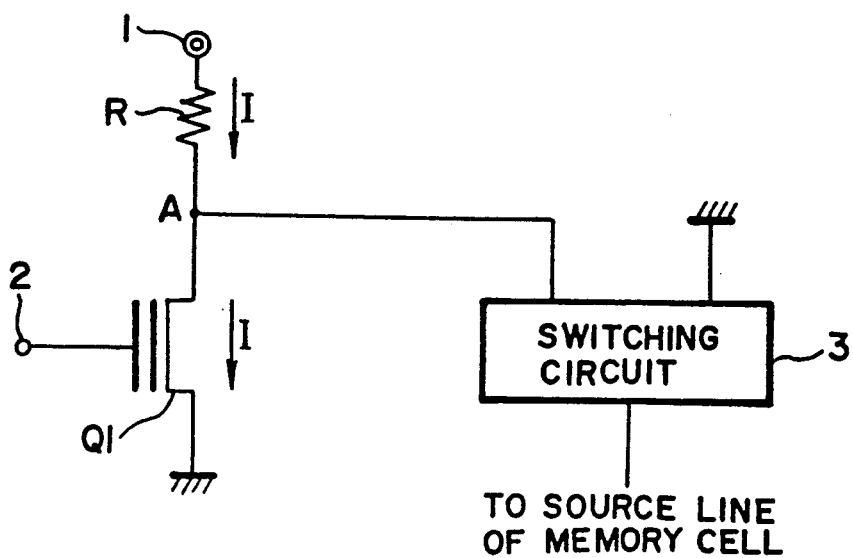
FIG. 8 is a block diagram showing an arrangement of a first embodiment according to the present invention.

FIG. 8 shows in block diagram an arrangement of the first embodiment according to the invention. As shown in FIG. 8, one end of a resistor R is connected to a high voltage power supply terminal 1 (for example, 12.5 V) and the other end thereof is connected to a node A. The drain of a reference transistor Q1 having the same configuration as that of the memory cell is connected to the node A, the gate thereof is connected to a constant-voltage terminal 2, and the source thereof is grounded.

The node A is connected to a switching circuit 3. This switching circuit 3 switches the connection of the source line of the memory cell to the node A during the erasure operation and to the ground at other times. It should be noted that the floating gate/substrate insulating film of the reference transistor Q1 is formed in the same process step as in that for the floating gate/substrate insulating film of the memory cell, and further the thicknesses of these insulating films are substantially the same.

As to the operation, a high voltage $V_{PP}$ is applied to the high voltage power supply terminal 1 during the erasure operation and a constant-voltage of, for example, 5 V is applied to the constant-voltage terminal 2. Then, the reference transistor Q1 turns to an ON state, so that the constant-current I flows across the drain/source of the reference transistor Q1 and the resistor R. The voltage at the node A is given as $(V_{PP}-RI)$. This voltage $(V_{PP}-RI)$ is supplied to the source of the memory cell through the switching circuit 3 during the erasure operation.

Here, consideration is given to the case wherein a floating gate/substrate insulating film happens to be thin due to the variations developed in the course of fabrication. Since the floating gate/substrate insulating film of the reference transistor Q1 is formed in the same process step as for the floating gate/substrate insulating film of the memory cell transistor, the thickness of the insulating film of the reference transistor Q1 is also thin.

Figure 9:
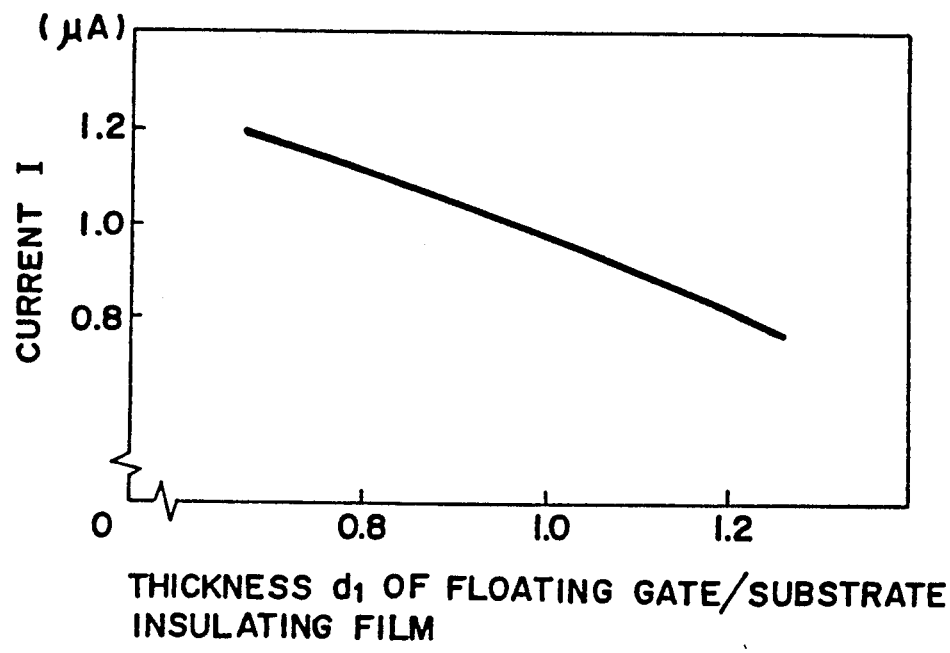
FIG. 9 is a graph showing a relationship between a thickness of a floating gate/substrate insulating film of a transistor and an ON current I of the transistor according to the invention.
Figure 10:
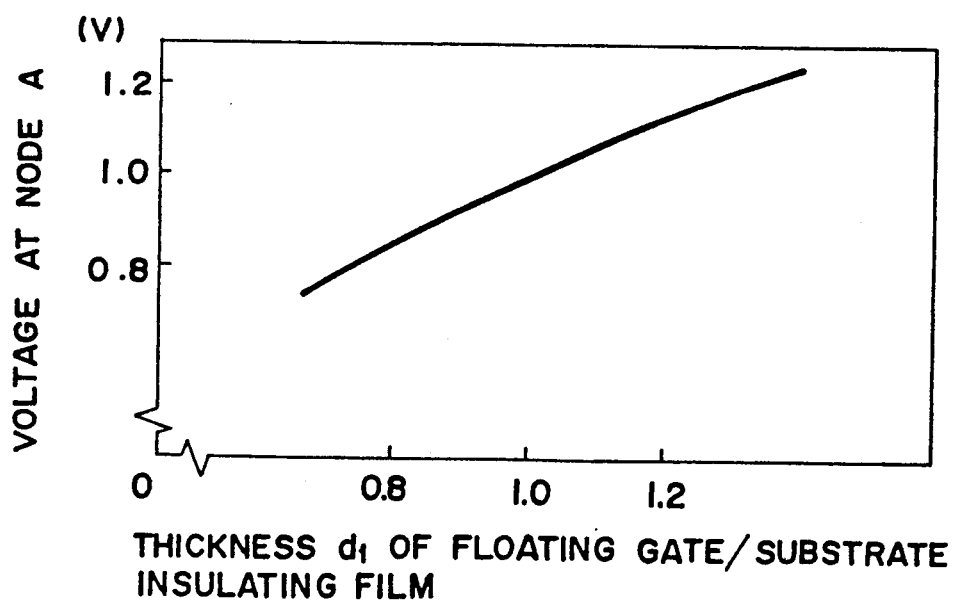
FIG. 10 is a graph showing a relationship between a thickness of a floating gate/substrate insulating film of a transistor and a voltage V at a node A according to the invention.

FIG. 9 shows a relationship between the thickness of the floating gate/substrate insulating film of the reference transistor Q1 (hereinafter the thickness being referred to as "$d_1$") and the constant-current I. As seen from FIG. 9, when $d_1$ decreases, the constant current I increases. The voltage at point A is given as $(V_{PP}-RI)$ so that, when $d_1$ decreases, the voltage at point A also decreases as shown in FIG. 10. This means that the voltage applied to the source line of the memory cell also decreases.

As a result, the erasure speed of the memory cell is maintained substantially constant. In this way, the change in the erasure speed that may develop due to any thickness variations in the floating gate/substrate insulating film can be corrected by causing the applied voltage to be changed accordingly. This is the point which is featured by the present invention.

Figure 11:
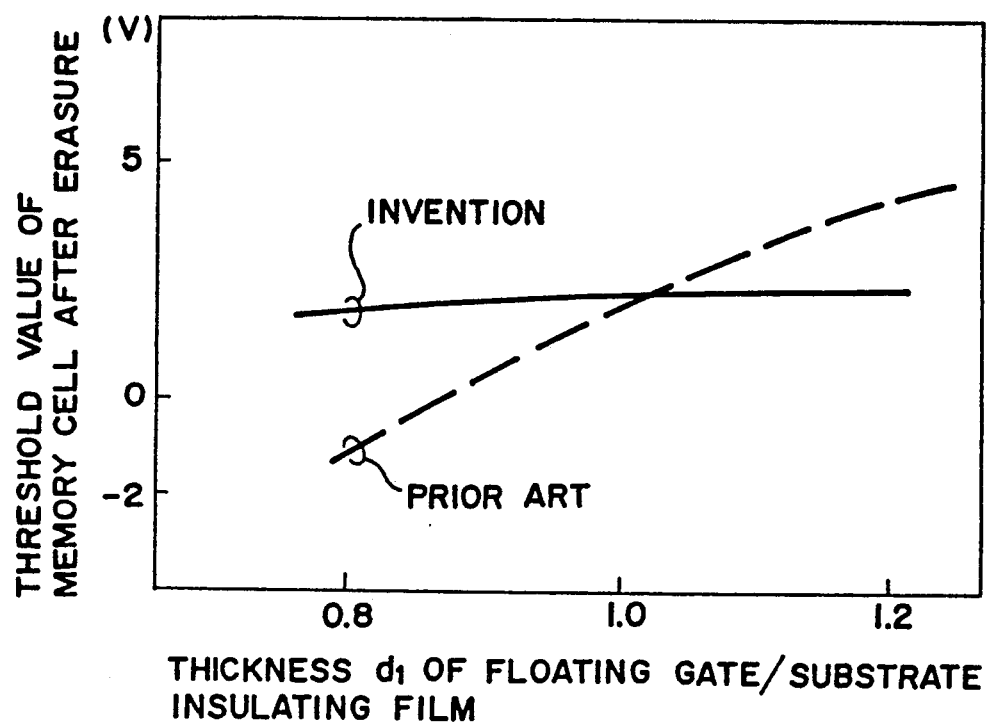
FIG. 11 is a graph showing a relationship between threshold values of a memory cell after erasure and a thickness of a floating gate/substrate insulating film according to the invention.

FIG. 11 shows a relationship between the threshold values of the memory cell after erasure and the thickness d1 of the floating gate/substrate insulating film. It can be appreciated from this that, according to the invention, even in the presence of variations in the thickness d1 of the floating gate/substrate insulating film, the threshold values of the memory cell after erasure can be maintained substantially constant as shown by a solid line.

Figure 12:
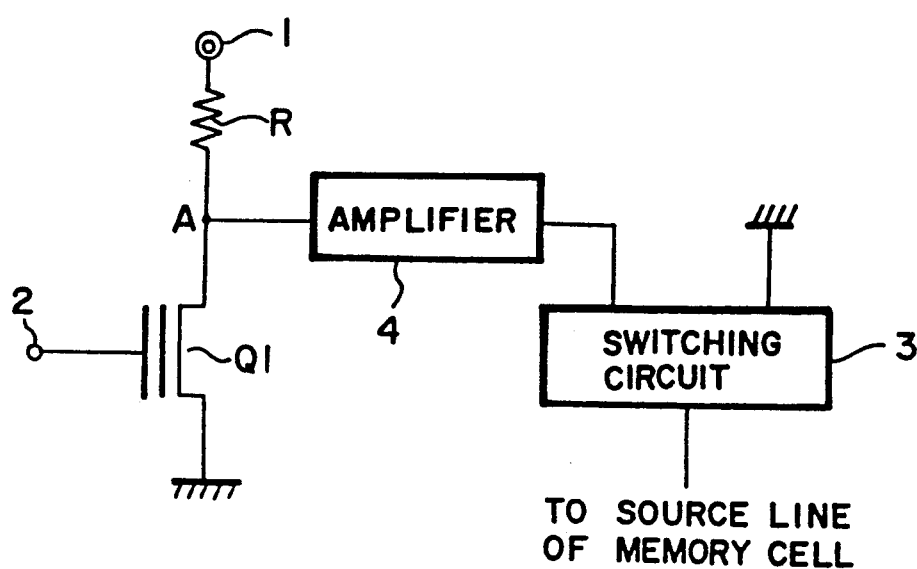
FIG. 12 is a block diagram showing an arrangement of a second embodiment according to the invention.

FIG. 12 shows in block diagram an arrangement of the second embodiment according to the invention.

The arrangement of the second embodiment is substantially the same as that of the first embodiment. The difference herein from the first embodiment resides in the provision of a voltage amplifier 4 which has a voltage amplification factor A and which is connected between the node A and the switching circuit 3.

Where the voltage amplification factor is A=1, the performance involved will be the same as in the first embodiment. By making an appropriate setting of A, it is possible to set a desired rate of changes in the voltage inputted to the switching circuit 3 in response to potential changes at the node A. Thus, the optimum erasure voltage can easily be set.

Figure 13:
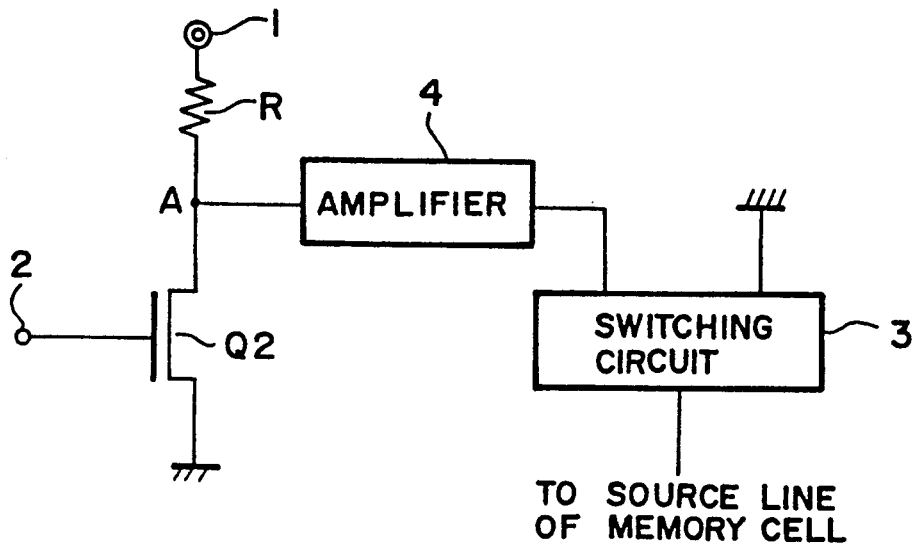
FIG. 13 is a block diagram showing an arrangement of a third embodiment according to the invention.

FIG. 13 shows in block diagram an arrangement of the third embodiment according to the invention.

Figure 14:
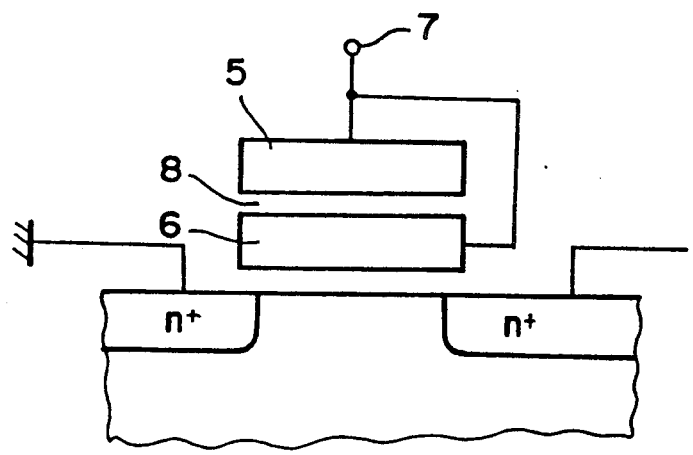
FIG. 14 is a schematic representation of a transistor shown in FIG. 13.

In this embodiment, the reference transistor Q2 has a gate terminal 7 with a control gate 5 and a floating gate 6 being short-circuited as shown in FIG. 14. In this way, it is possible to eliminate any factors, other than those causing the variations in the thickness of the floating gate/substrate insulating film, which may have influence on the changes in the ON current of the transistor Q2, for example, the variations in thickness of the insulating film 8 between the floating gate 6 and the control gate 5. Thus, it can be further ensured that the supply of erasure voltage be precisely responsive to variations in the thickness of the floating gate/substrate insulating film of the memory cell.

As explained above, in the erasure control circuit according to the invention, the reference transistor is provided which is the same structure as the memory cell and in which the floating gate/substrate insulating film is formed in the same fabricating process for the floating gate/substrate insulating film of the memory cell transistor whereby the thicknesses of these insulating films are made substantially the same. During the erasure operation, the erasure voltage proportional to the ON current of the reference transistor is supplied to the source of the memory cell. Thus, even when the thickness of the floating gate/substrate insulating film of the memory cell becomes too thick or too thin due to production variations, in which case an over-erase or a deficient erase is likely to occur, it is possible to prevent such an over-erase or a deficient erase by effecting the corresponding changes in the erasure voltage.

Thus, the invention permits widening of a range of production tolerances in respect of the floating gate/substrate insulating film of the memory cell. Also, with respect to the setting of the erasure time, it is not necessary to provide such a margin as may be otherwise required to accommodate variations in the floating gate/substrate insulating film.

Therefore, the non-volatile semiconductor memory device achieved by the invention is higher in the production yield than in the prior art and is enhanced in its erasure performance reliability. It has been proven by comparison with the prior art that, when the resistance value of the resistor R is set to about 30 K$\Omega$ and the high voltage $V_{PP}$ is set to 14 V in the circuit shown in FIG. 8, the range of production tolerances in the floating gate/substrate insulating film according to the invention is widened by about 50%.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A non-volatile semiconductor memory device having an erasure control circuit which, during erasure operation, is electrically connected through a switching circuit to a source of a memory cell transistor having a floating gate, said erasure control circuit comprising:

a resistor element having one end connected to a power supply terminal and the other end connected to a node which is electrically connected to the source of said memory cell transistor during the erasure operation; and a reference transistor which has the same structure as that of said memory cell transistor, and in which a drain electrode is connected to said node, a gate electrode is connected to a constant-voltage input terminal and a source electrode is grounded, said reference transistor having a floating gate/substrate insulating film formed simultaneously through a common process for forming a floating gate/substrate insulating film of said memory cell transistor and the floating gate/substrate insulating film of said reference transistor having substantially the same thickness as that of said memory cell transistor.

2. A non-volatile semiconductor memory device according to claim 1, in which said erasure control circuit further comprises a voltage amplifier connected between said node and said switching circuit.

3. A non-volatile semiconductor memory device according to claim 1, in which said reference transistor has a control gate and a floating gate that are short-circuited.

* * * * *